(12) United States Patent
Jones et al.

(10) Patent No.: US 6,708,190 B1
(45) Date of Patent: Mar. 16, 2004

(54) REDUCED PRODUCT TERM CARRY CHAIN

(75) Inventors: Christopher W. Jones, Pleasanton, CA (US); Roger Bettman, Los Altos, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 613 days.

(21) Appl. No.: 09/587,708

(22) Filed: Jun. 5, 2000

(51) Int. Cl.$^7$ .................................................. G06F 7/38
(52) U.S. Cl. .................................... 708/230; 326/39
(58) Field of Search ............................ 708/230, 232, 708/234, 235, 236; 326/37, 38, 39, 41

(56) References Cited

U.S. PATENT DOCUMENTS 5,220,214 A * 6/1993 Pedersen ..................... 326/46
5,359,242 A * 10/1994 Veenstra ...................... 326/39
5,898,602 A * 4/1999 Rothman et al. ........... 708/230
6,034,546 A   3/2000 Jones et al.

* cited by examiner

Primary Examiner—Chuong Dinh Ngo
(74) Attorney, Agent, or Firm—Christopher P. Maiorana, P.C.

(57) ABSTRACT

A programmable logic device comprising one or more macrocells and a product term array. The macrocells may comprise logic that may be configured to (i) generate and propagate a carry signal and (ii) generate a sum bit. The product term array may comprise two product terms per macrocell.

20 Claims, 5 Drawing Sheets

REDUCED PRODUCT TERM CARRY CHAIN

FIELD OF THE INVENTION

The present invention relates to a method and/or architecture for carry chains generally and, more particularly, to a method and/or architecture for implementing a reduced product term carry chain and adder.

BACKGROUND OF THE INVENTION

A programmable logic device (PLD) provides an economical and efficient means for implementing predetermined Boolean logic functions in an integrated circuit. Such a device consists of, generally, an AND plane configured to generate predetermined product terms in response to a plurality of inputs, a group of fixed/programmable OR gates configured to generate a plurality of sum-of-products (SOP) terms in response to the product terms, and a number of logic elements (i.e., macrocells) configured to generate a desired output in response to the sum-of-products terms. The sum-of-products terms can also be generated using programmable NOR-NOR logic or programmable NAND-NAND logic.

One of the main disadvantages of complex programmable logic devices (CPLDs) and other programmable logic devices (PLDs) that do not contain dedicated carry chain circuitry is the size and performance of the arithmetic function implementations. Arithmetic function implementations in CPLDs can be optimized for area and/or speed. These optimizations, however, are based only on optimizing the topology of the implementation. Without dedicated carry chain circuitry, arithmetic function implementations that are optimized for speed require a large amount of device resources. The required resources can grow to become a significant portion of the targeted device, thereby limiting the amount of resources for other portions of the design. Conversely, implementations that are optimized for area require fewer device resources, but are typically much slower than those optimized for speed. The coarse-grain nature of the CPLD does not allow for a good speed/area tradeoff when implementing arithmetic functions.

Referring to FIG. 1, a block diagram of a PLD 10 containing dedicated carry chain circuitry is shown. The PLD 10 has an AND (product term) array 12, a product term matrix (PTM) 14, and a macrocell 16. The AND plane 12 generates carry product term signals CPT0 and CPT1. The carry product terms are presented to the PTM 14 and the macrocell 16. The PTM 14 includes a fixed 16-input OR gate 18. The OR gate 18 generates a sum of products term signal OR_IN that is presented to the macrocell 16.

The macrocell 16 comprises a multiplexer 20, an AND gate 22, a multiplexer 24, an XOR gate 26, a register 28, and a multiplexer 30. The multiplexer 20 has a non-inverting input that receives the signal CPT0, an inverting input that receives the signal CPT1, a control input that receives a control signal from the AND gate 22, and an output that presents the signal $C_i$ to a first input of the multiplexer 24 and to an output of the macrocell 16. The AND gate 22 generates the control signal in response to a carry in signal $C_{i-1}$ and a configuration bit C2.

The multiplexer 24 has a second input that is connected to a supply voltage VCC, a third input that is connected to a Q output of the register 28, and a fourth input that is connected to a supply voltage ground VSS. The multiplexer 24 selects one of the input signals for presentation to a first input of the XOR gate 26 in response to a pair of configuration bits C0 and C1.

The XOR gate 26 has a second input that receives the signal OR_IN and an output that presents a signal to a D input of the register 28 and a first input of the multiplexer 30. The multiplexer 30 can select either the output of the XOR gate 26 or the Q output of the register 28 for presentation as an output signal OUT in response to a configuration bit Cx.

Referring to FIG. 2, a block diagram illustrating a 4-bit ripple carry adder 32 implementing the macrocell structure of FIG. 1 is shown. The ripple carry adder 32 generates output sum bits $S_0$–$S_3$ in response to sum operand input bits $A_0$–$A_3$ and $B_0$–$B_3$. The 4-bit ripple carry full adder includes 4 macrocells 16a–16d. Each of the macrocells 16a–16d is similar to the macrocell 16 of FIG. 1. However, the register 28 and the multiplexer 30 have not been included in any of the macrocells in FIG. 2 for clarity. For the purposes of FIG. 2, it is assumed that the configuration bit Cx is set to select the output of the gate 26 and to bypass the register 28. A description of the operation of a ripple carry adder may be found in U.S. Pat. No. 6,034,546, which is hereby incorporated by reference in its entirety.

For the first sum operand bits $A_0$ and $B_0$, the first configuration bit $C2_0$ is set to 0, so as to cause the multiplexer 20a to always select the signal $CPT0_0$, that is set to $CIN_0$, the initial carry into the sum. Since the signal $CPT0_0$ is always selected by the multiplexer 20a, $CPT1_0$ is not used. The signal $OR\_IN_0$ is set to the result of the XOR operation $A_0 \oplus B_0$. Configuration bits $C0_0$ and $C1_0$ are set to 1 and 0, respectively, so that the multiplexer 24a presents the signal $CIN_0$ to a first input of the gate 26a. The gate 26a performs the XOR operation $OR\_IN_0 \oplus CIN_0$ and presents the result as the least significant sum bit $S_0$.

The output of the multiplexer 20a (i.e., $CIN_0$) is propagated to the select line of the multiplexer 20b, as $C2_1$ is set to 1, causing the output of the gate 22b to follow the output of the multiplexer 20a. To generate the signal $CIN_1$ (i.e., the carry input for sum bit $S_1$) the signal $CPT0_1$ is set to $A_0*B_0$ and the signal $CPT1_1$ is set to $/A_0*/B_0$. The multiplexer 20b, therefore, outputs the carry-in signal $CIN_1$ for sum bit $S_1$. The multiplexer 24b is configured to present the signal $CIN_1$ to an input of the gate 26b. Thereafter, the gate 26b presents the sum bit $S_1$, the result of the logical XOR operation on $OR\_IN_1$ and $CIN_1$. Sum bits $S_2$ and $S_3$ are obtained in a similar manner.

Each macrocell 16a–16d requires 4 product terms to implement a 1-bit ripple carry adder. Two dedicated carry product terms are used to generate the carry input $C_i$ (i.e., $A_{i-1}*B_{i-1}$ and $/A_{i-1}*/B_{i-1}$). Two general purpose product terms are needed to generate the XOR, ($A_i \oplus B_i$), one for $A_i*/B_i$ and one for $/A_i*B_i$. The second two product terms are implemented in the AND-OR plane of the PLD 10.

The macrocell 16 has a disadvantage of requiring 4 product terms per macrocell to implement a ripple carry adder. Product terms can require a large number of transistors to implement. For example, a PLD with 39 inputs can require 78 to 156 or more transistors per product term. Reducing the number of product terms required to implement a carry chain can reduce the number of transistors required and reduce the die size of a PLD. However, the structure of the macrocell 16 limits the amount of reduction possible.

An architecture and/or method for implementing a carry chain with two product terms per macrocell that can implement a ripple carry adder would be desirable.

SUMMARY OF THE INVENTION

The present invention concerns a programmable logic device comprising one or more macrocells and a product term array. The macrocells may comprise logic that may be configured to (i) generate and propagate a carry signal and (ii) generate a sum bit. The product term array may comprise two product terms per macrocell.

The objects, features and advantages of the present invention include providing a method and/or architecture for implementing a reduced product term carry chain that may (i) be implemented in a complex programmable logic device (CPLD), (ii) require fewer transistors, (iii) reduce die size, and/or (iv) implement an n-bit ripple carry adder with two product terms per macrocell.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
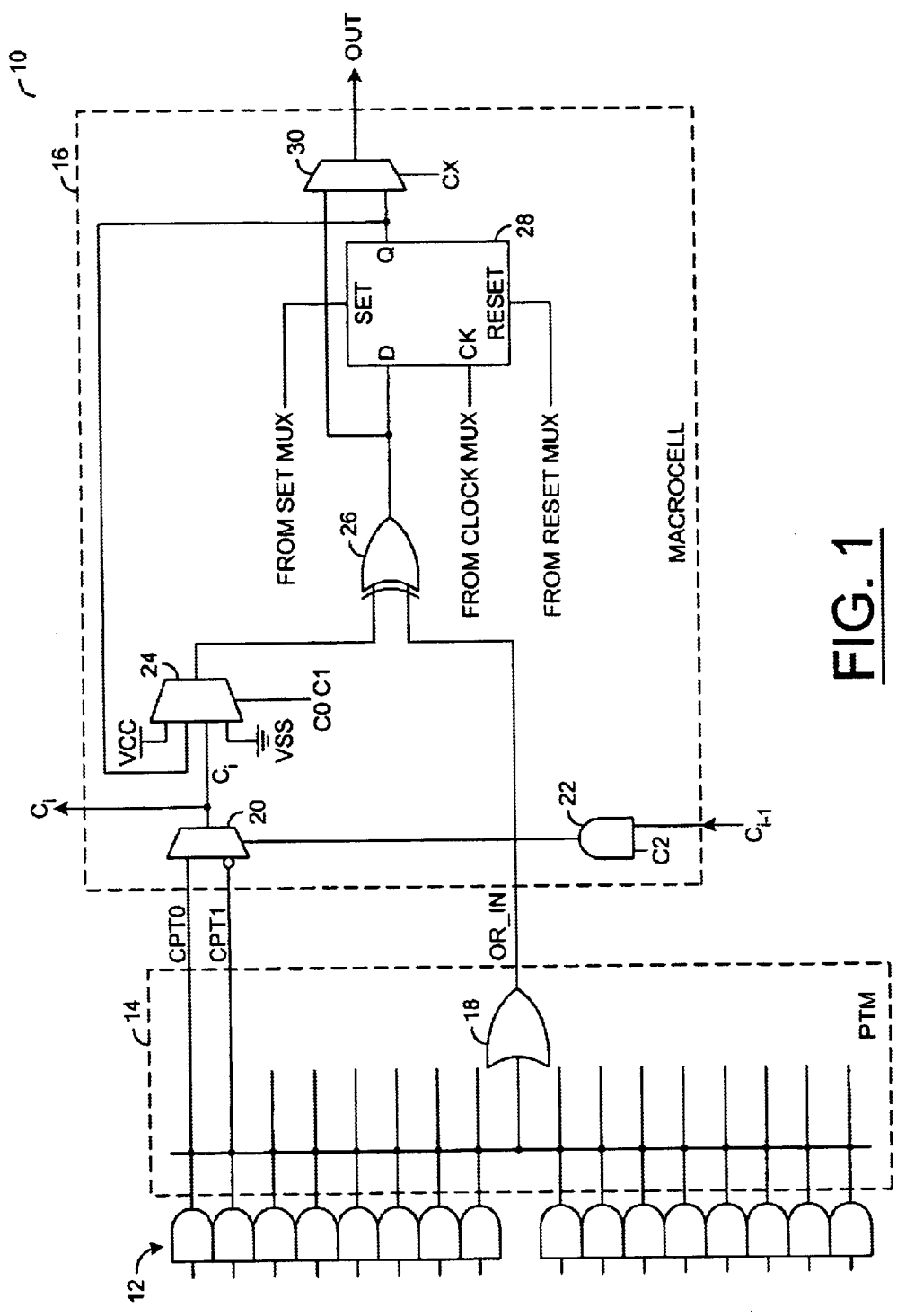
FIG. 1 is a block diagram of a macrocell that includes dedicated carry chain circuitry.
Figure 2:
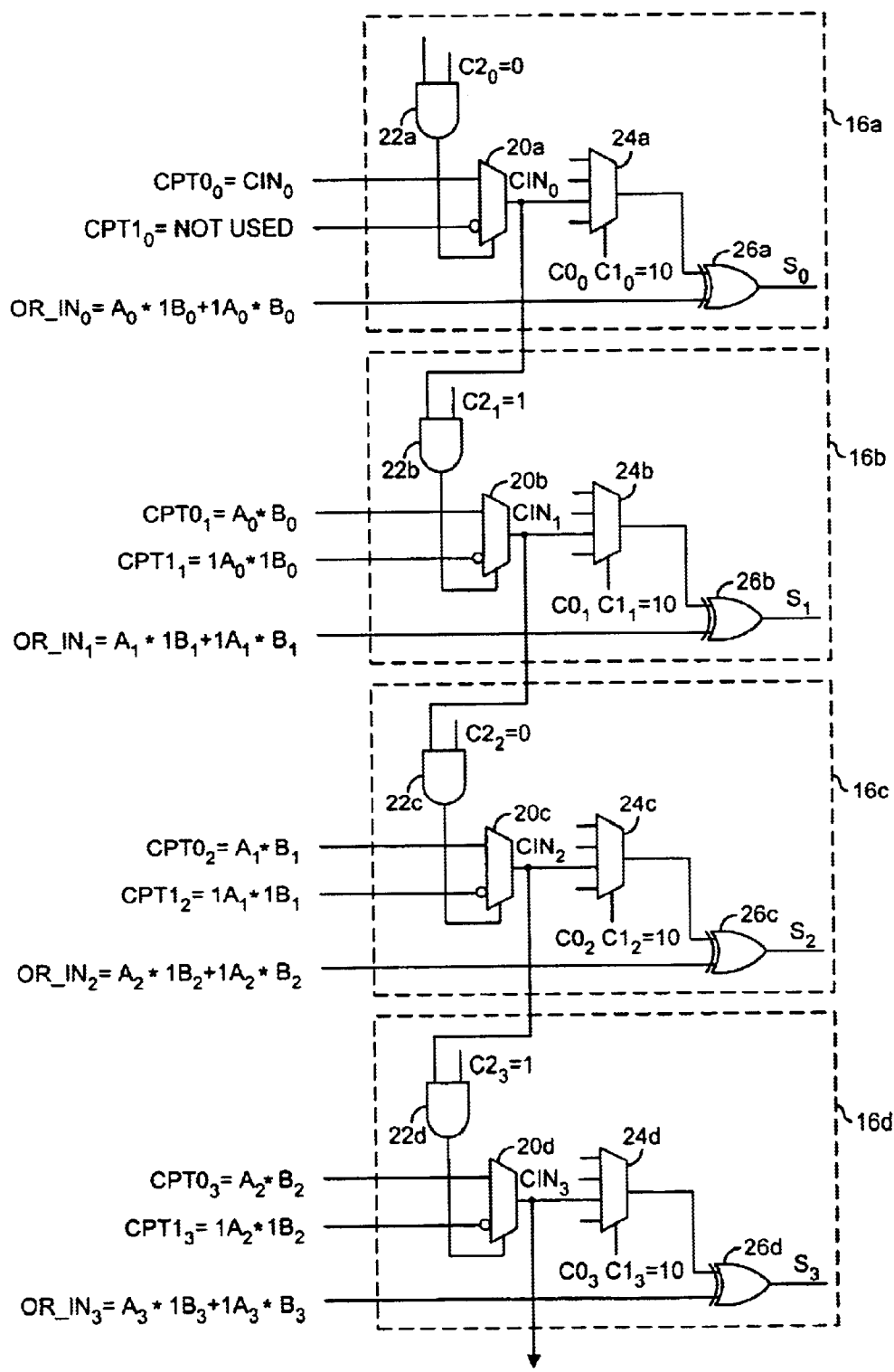
FIG. 2 is a block diagram illustrating a 4-bit ripple carry adder implemented using the macrocell of FIG. 1.
Figure 3:
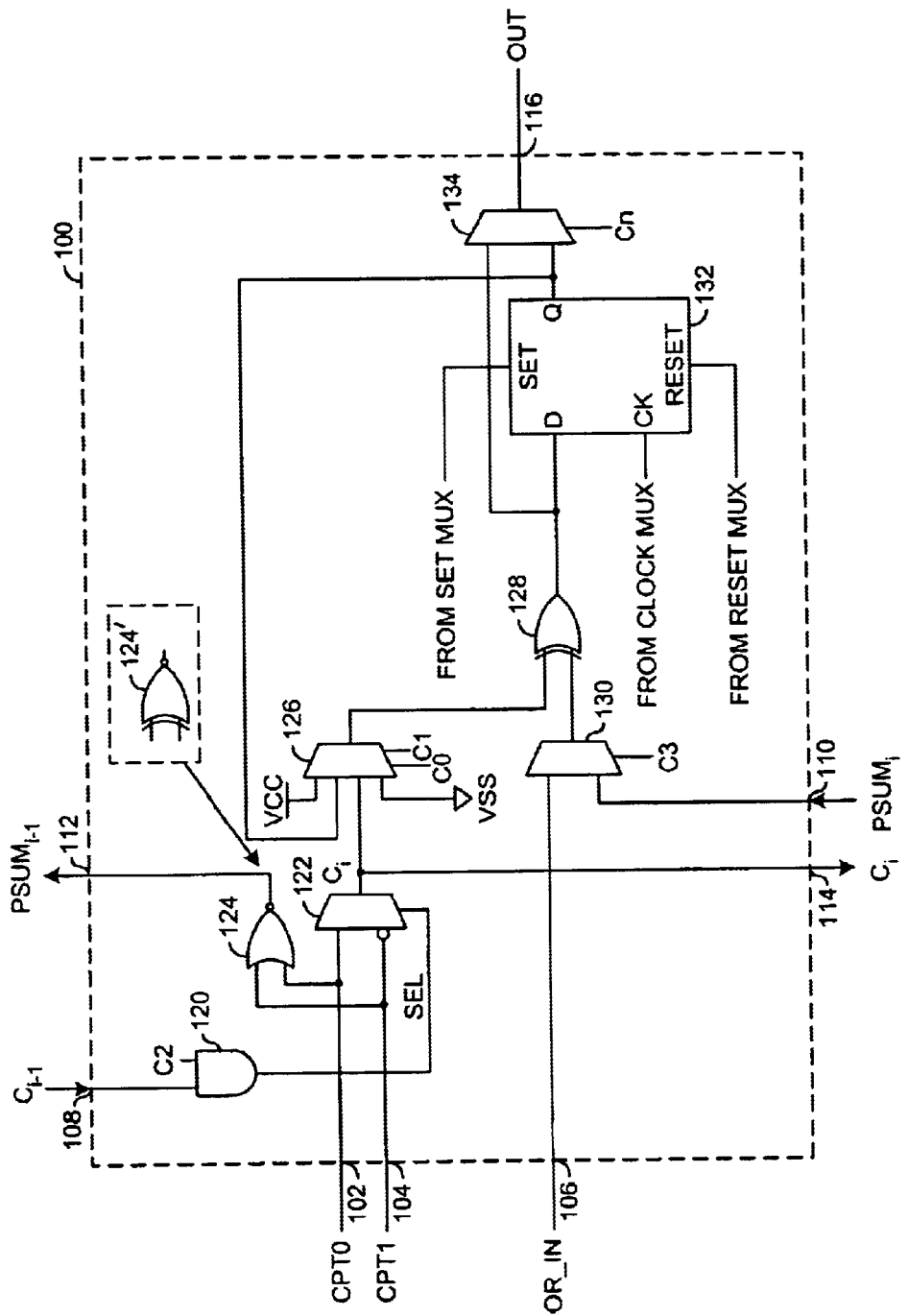
FIG. 3 is a block diagram of a circuit 100 illustrating a preferred embodiment of the present invention.

Referring to FIG. 3, a block diagram of a circuit 100 is shown in accordance with a preferred embodiment of the present invention. The circuit 100 may be implemented, in one example, as a macrocell in a programmable logic device (PLD). The circuit 100 may have an input 102 that may receive a signal (e.g., CPT0), an input 104 that may receive a signal (e.g., CPT1), an input 106 that may receive a signal (e.g., OR_IN), an input 108 that may receive a signal (e.g., $C_{i-1}$), an input 110 that may receive a signal (e.g., $PSUM_i$), an output 112 that may present a signal (e.g., $PSUM_{i-1}$), an output 114 that may present a signal (e.g., $C_i$), and an output 116 that may present a signal (e.g., OUT).

The signals CPT0 and CPT1 may be generated in an AND (product term) plane of the PLD. The signals CPT0 and CPT1 may be implemented, in one example, as dedicated carry product term input signals. In one example, the signal CPT0 may be the result of ANDing a pair of AND plane inputs (e.g., A*B). The signal CPT1 may be generated by ANDing a complement of the AND plane inputs (e.g., /A*/B). The AND plane inputs A and B may be, in one example, sum operands that may be used to generate a sum output bit according to the following EQUATION 1:

$$S = A \oplus B \oplus C$$

where S is the sum bit and C is a carry input bit. The signal OR_IN may be generated, in one example, as a sum of products term. In one example, the signal OR_IN may be generated in a product term matrix (PTM) or a product term allocator (PTA) of a PLD. The circuit 100 may be used to implement a stage of a ripple carry full adder. The signal $PSUM_{i-1}$ may be generated, in one example, in response to the signals CPT0 and CPT1. When the signal CPT0 is set to A*B and the signal CPT1 is set to /A*/B, the signal $PSUM_{i-1}$ may be similar to a logical XOR of the AND plane inputs (e.g., A⊕B). A further discussion of the signal $PSUM_{i-1}$ may be found in connection with TABLE 1 below. In a multi-bit ripple carry full adder where each stage is implemented with the circuit 100, the signal $PSUM_{i-1}$ of a current stage may represent a logical XOR of the AND plane inputs for a sum bit of a previous stage (e.g., $A_{i-1} \oplus B_{i-1}$) The signal $PSUM_{i-1}$ of a next stage may be presented as the signal $PSUM_i$ of the current stage. For example, the signal $PSUM_i$ of the current stage may be similar to a logical XOR of AND plane inputs for a sum bit of a current stage (e.g., $A_i \oplus B_i$).

A number of the, signals $C_{i-1}$, $C_i$, CPT0, CPT1, OR_IN, $PSUM_i$, and $PSUM_{i-1}$ may be used to implement a sum and carry chain with two product terms. In one example, a number of circuits similar to the circuit 100 may be connected together to implement an N-bit ripple carry adder, where N is an integer. The N-bit ripple carry adder implemented in accordance with the present invention will generally require only two product terms per macrocell.

The circuit 100 may comprise a gate 120, a multiplexer 122, a gate 124, a multiplexer 126, a gate 128, a multiplexer 130, a register 132, and a multiplexer 134. The gate 120 may be implemented, in one example, as an AND gate. The gate 124 may be implemented, in one example, as a NOR gate. The gate 128 may be implemented, in one example, as an exclusive OR gate (XOR). However, other types of gates may be implemented to meet the design criteria of a particular application. For example, in an alternative embodiment, the gate 124 may be implemented as an XNOR gate 124' or other appropriate logic circuit. In another alternative embodiment, the gate 124 may be implemented as either an OR gate or an XOR gate and the gate 128 may be implemented as an XNOR gate or other appropriate logic circuit.

The multiplexers 122, 130 and 134 may be implemented, in one example, having two inputs and a single control bit. The multiplexer 126 may be implemented, in one example, having 4 inputs and 2 control bits. However, other types of multiplexer circuits may be implemented to meet the design criteria of a particular application. The register 132 may be implemented, in one example, as a D-type flip-flop. However, other types of flip-flops may be implemented to meet the design criteria of a particular application.

The signal $C_{i-1}$ may be presented to a first input of the gate 120. A user configurable signal (e.g., C2) may be presented to a second input of the gate 120. An output of the gate 120 may present a control signal (e.g., SEL) to a control input of the multiplexer 122. The gate 120 may be a carry decoupler circuit. Setting the signal C2 to 0 within a particular macrocell will generally decouple the macrocell from a next adjacent macrocell by interrupting the propagation of the signal $C_{1-1}$ to the next macrocell. Decoupling one macrocell from the next by setting C2 to 0 may have an added benefit of permitting the gate 128 and the signal CPT0 to be used for additional logic synthesis.

The multiplexer 122 may have, in one example, an inverting input and at least one non-inverting input. The signal CPT0 may be presented to a non-inverting input of the multiplexer 122 and a first input of a gate 124. The signal CPT1 may be presented to the inverting input of the multiplexer 122 and a second input of the gate 124. The gate 124 may have an output that may present the signal $PSUM_{i-1}$. When the carry product terms CPT0 and CPT1 are set as follows:

$$CPT0 = A*B \quad CPT1 = /A*/B,$$

the signal $PSUM_{i-1}$ may be similar to the logical XOR of A and B (A⊕B). The XOR of A and B may be generated, in one example, from the signals CPT0 and CPT1 either by a NOR (CPT0, CPT1) or an XNOR (CPT0, CPT1) as illustrated in the following TABLE 1:

TABLE 1

| A | B | CPT0 A*B | CPT1 /A*/B | NOR /(CPT0 + CPT1) | XNOR /(CPT0⊕CPT1) |
|---|---|---|---|---|---|
| 0 | 0 | 0 | 1 | 0 | 0 |
| 0 | 1 | 0 | 0 | 1 | 1 |
| 1 | 0 | 0 | 0 | 1 | 1 |
| 1 | 1 | 1 | 0 | 0 | 0 |

Since implementation of a NOR gate is generally simpler than an XNOR gate, the gate 124 may be implemented as a NOR gate in a preferred embodiment of the present invention.

The multiplexer 122 may have an output that may present the signal Ci to a first input of the multiplexer 126 and the output 114 of the circuit 100. The signal $C_i$ may be a carry input for a current sum bit and the multiplexer 122 may be thought of as the carry generator. The multiplexer 126 may have a second input that may receive a signal from a Q output of the register 132, a third input that may be connected to a supply voltage (e.g., VCC), and a fourth input that may be connected to a supply voltage ground (e.g., VSS). A user configurable signal (e.g., C0) may be presented to a first control input of the multiplexer 126. Another user configurable signal (e.g., C1) may be presented to a second control input of the multiplexer 126. An output of the multiplexer 126 may present a signal to a first input of the gate 128.

The signal OR_IN may be presented to a first input of the multiplexer 130. The signal $PSUM_i$ may be presented to a second input of the multiplexer 130. A user configurable signal (e.g., C3) may be presented to a control input of the multiplexer 130. The multiplexer 130 may be, in one example, an input selector for the circuit 100. The multiplexer 130 may have an output that may present either the signal OR_IN or the signal $PSUM_i$ to a second input of the gate 128.

The gate 128 may have an output that may present a signal to a D input of the register 132 and a first input of the multiplexer 134. The register 132 may have a set input that may receive a signal from a multiplexer (not shown) configured to select between one or more set signals, a reset input that may receive a signal from a reset multiplexer (not shown) that may be configured to select from one or more reset signals, and a clock input that may receive a clock signal from a clock multiplexer (not shown) that may select from one or more clock signals. The register 132 may present a signal at the Q output that may be presented to a second input of the multiplexer 134. The multiplexer 134 may select the output of the gate 128 or the Q output of the register 132 for presentation as a signal OUT in response to a user configurable signal (e.g., Cn) presented at a control input of the multiplexer 134. The user configurable signals C0, C1, C2, C3, and Cn may be implemented as configuration bits.

Figure 4:
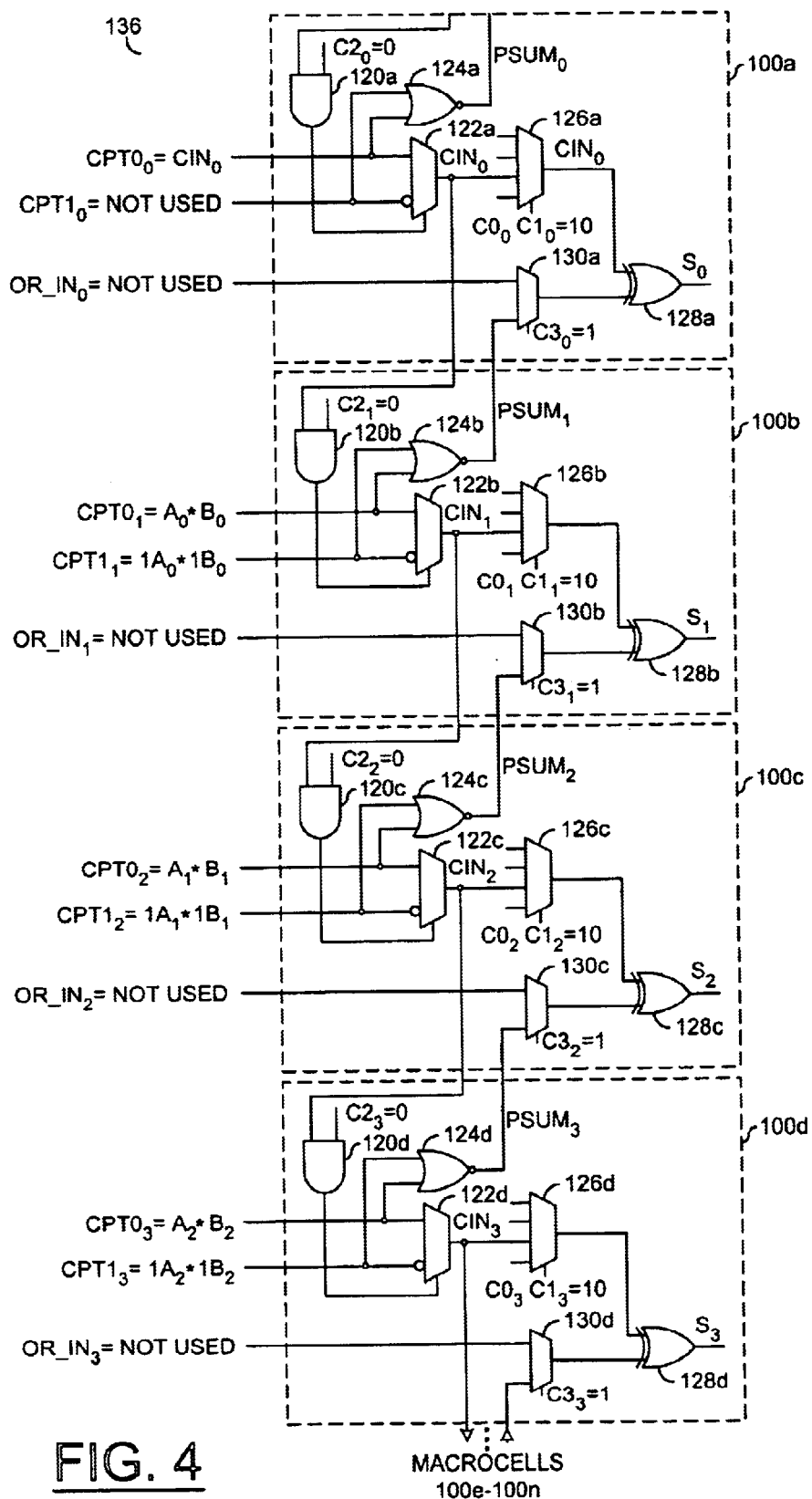
FIG. 4 is a block diagram of an n-bit ripple carry adder implemented using a number of macrocells as described in FIG. 3.

Referring to FIG. 4, a block diagram illustrating a portion of an N-bit ripple carry adder 136 implemented in accordance with the present invention is shown. In one example, the N-bit ripple carry adder 136 may be implemented with N+1 macrocells, where each macrocell may be configured to receive two product terms. However, the N-bit ripple carry adder 136 may be implemented, in another example, with N macrocells 100a–100n, where the last macrocell 100n may be configured to receive four product terms (e.g., $CPT0_n$, $CPT1_n$, and OR_IN). Each of the macrocells 100a–100n may be implemented similarly to the macrocell 100 of FIG. 3. However, the registers 132a–132n and the multiplexers 134a–134n have not been included in FIG. 4 for clarity. For the purposes of FIG. 4, it may be assumed that the configuration bit CX of each of the macrocells 100a–100n may have been set so as to select the output of the gates 128a–128n and to bypass the registers 132a–132n.

For a first set of AND plane inputs (e.g., $A_0$ and $B_0$), the configuration bit $C2_0$ may be set to a first state (e.g., a logical LOW, or 0). When the configuration bit $C2_0$ is set to the first state, the multiplexer 122a may be configured to select the signal $CPT0_0$ as the carry input to the macrocell 100a. An initial carry into the sum (e.g., $CIN_0$) may be presented as a signal $CPT0_0$. The signal $CPT1_0$ may be unused. The multiplexer 122a may present the signal $CIN_0$ to an input of the multiplexer 126a. The user configurable signals $C0_0$ and $C1_0$ may be set to 1 and 0, respectively, so that the multiplexer 126a may present the signal $CIN_0$ to a first input of the gate 128a. The user configurable signal $C3_0$ may be set, in one example, to a second state (e.g., a logical HIGH, or 1). When the signal $C3_0$ is in the second state, the multiplexer 130a may select a signal (e.g., $PSUM_1$) that may be presented at an output of the macrocell 100b for presentation to a second input of the gate 128a. The signal $PSUM_1$ may be generated by a logical NOR or XNOR of the signals $CPT0_1$ and $CPT1_1$. The signal $PSUM_1$ may be similar to the result of a logical XOR of the AND plane inputs $A_0$ and $B_0$. The gate 128a may have an output that may present a signal (e.g., $S_0$). The signal $S_0$ may be a least significant sum output of the N-bit ripple carry adder 136.

For a next and subsequent sets of AND plane inputs (e.g., $A_1$–$A_{n-1}$ and $B_1$–$B_{n-1}$), the signals $CPT0_1$–$CPT0_{n-1}$ may be presented to a non-inverting input of the multiplexers 122b–122n and a first input of the gates 124b–124n, respectively. The signals $CPT1_1$–$CPT1_{n-1}$ may be presented to an inverting input of the multiplexers 122b–122n and a second input of the gates 124b–124n, respectively. The gates 124b–124n may be configured to generate a signal (e.g., $PSUM_1$–$PSUM_{n-1}$) in response to a logical combination of the respective signals $CPT0_1$–$CPT0_{n-1}$ and $CPT1_1$–$CPT1_{n-1}$. The configuration bits $C2_1$–$C2_{n-1}$ may be set to a second state (e.g., a logical HIGH, or 1). When the configuration bits $C2_1$–$C2_{n-1}$ are set to the second state, the multiplexers 122b–122n may be configured to select the signals $CPT0_1$–$CPT0_{n-1}$ or the signals $CPT1_1$–$CPT1_{n-1}$ as the carry input signals $CIN_1$–$CIN_{n-1}$, in response to the carry input signals $CIN_0$–$CIN_{n-2}$, respectively. The multiplexers 122b–122n may present the signals $CIN_1$–$CIN_{n-1}$ to an input of the multiplexers 126b–126n. The user configurable signals $C0_1$–$C0_{n-1}$ and $C1_1$–$C1_{n-1}$ may be set to 1 and 0, respectively, so that the multiplexers 126b–126n may present the signals $CIN_1$–$CIN_{n-1}$ to a first input of the gates 128b–128n. The user configurable signals $C3_1$–$C3_{n-1}$ may be set, in one example, to the second state, a logical HIGH, or 1. When the signals $C3_1$–$C3_{n-1}$ are in the second state, the multiplexers 130b–130n may select the respective signal $PSUM_2$–$PSUM_n$ for presentation to a second input of the respective gates 128b–128n. Each of the signals $PSUM_2$–$PSUM_n$ may be generated, in one example, as a logical NOR or XOR of the signals $CPT0_2$–$CPT0_n$ and $CPT1_2$–$CPT1_n$, respectively. Each of the signals $PSUM_2$–$PSUM_n$ may be similar to a logical XOR of the respective AND plane inputs $A_2$–$A_n$ and $B_2$–$B_n$. The gates 128b–128n may have an output that may present a respective sum output signal (e.g., $S_1$–$S_{n-1}$).

The signals presented to the macrocells 100b–100n may be characterized as follows: the signal $CPT0_i$ for a particular macrocell 100$i$ will generally be set to a product of a pair of AND plane inputs for a preceding sum output $S_{i-1}$ (e.g., $A_{i-1}$ and $B_{i-1}$). The signal CPT1$_i$ will generally be set to a product of the complements of the pair of AND plane inputs for the preceding sum output (e.g., /$A_{i-1}$ and /$B_{i-1}$. The signal PSUM$_i$ will generally be similar to a logical XOR of the AND plane inputs for the preceding output (e.g., $A_{i-1} \oplus B_{i-1}$); The signal OR_IN$_i$ will generally not be used when the macrocells 100$a$–100$n$ are implemented as part of an N-bit ripple carry adder with N+1 macrocells.

Figure 5:
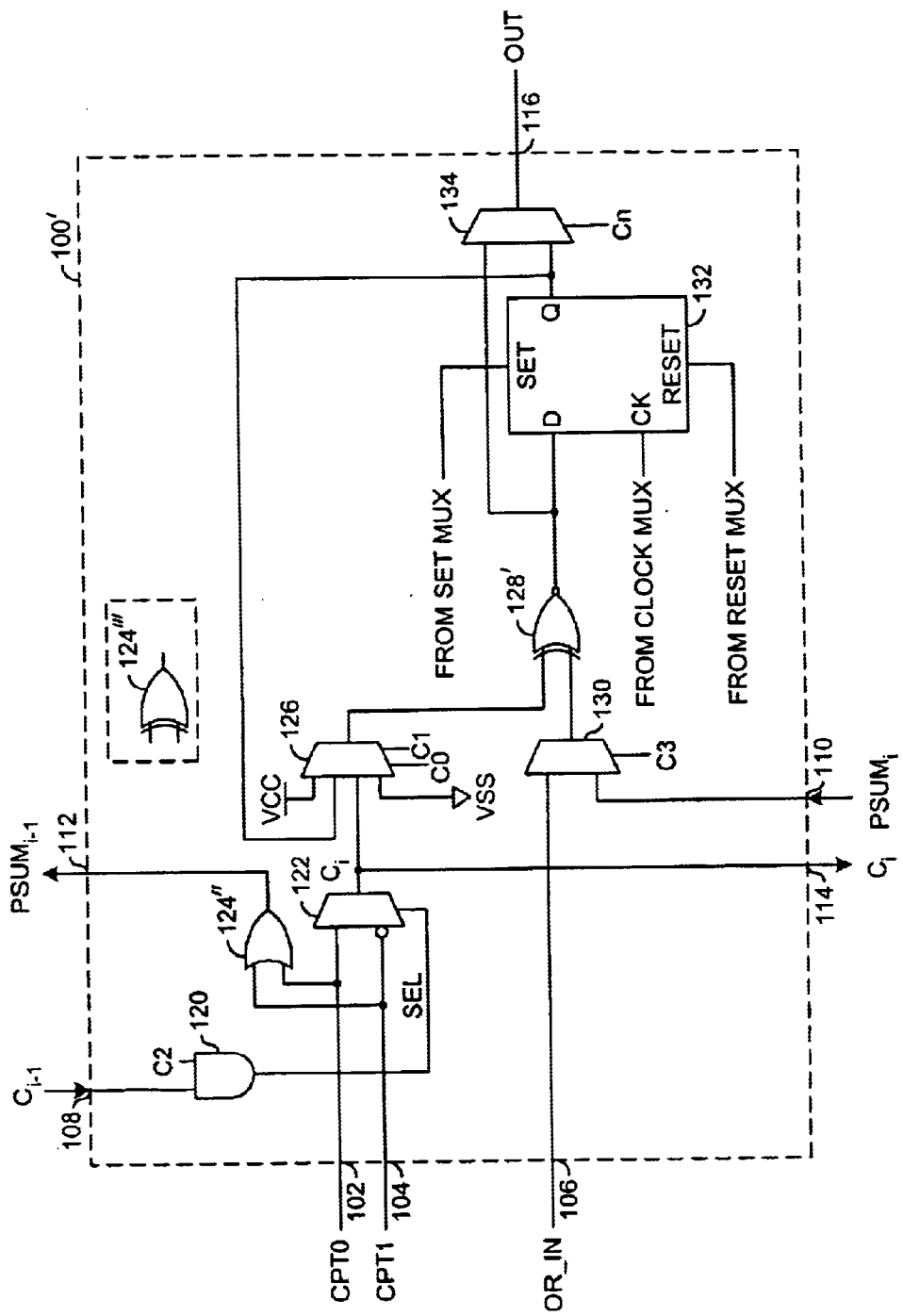
FIG. 5 is a block diagram of a circuit 100' illustrating an alternative embodiment of the present invention.

Referring to FIG. 5, a block diagram of a circuit 100' illustrating an alternative embodiment of the present invention is shown. The circuit 100' may be implemented similarly to the circuit 100 except that (i) the gate 128 may be implemented as an XNOR gate 128' and (ii) the gate 124 may be implemented as either an OR gate 124" or an XOR gate 124'".

The present invention may provide an architecture that may use two product terms per macrocell to implement a carry chain and/or a ripple carry full adder.

While the invention has been particularly shown and described with reference to the preferred embodiments thereof, it will be understood by those skilled in the art that various changes in form and details may be made without departing from the spirit and scope of the invention. For example, the carry chain architecture of the present invention may be incorporated into the macrocells illustrated in FIGS. 5–8 of U.S. Pat. No. 6,034,546.

What is claimed is:

1. A programmable logic device comprising:

one or more macrocells comprising logic configured to (i) generate a first intermediate signal in response to a first carry input product term and a second carry input product term, (ii) select one of said first and said second carry input product terms as a first carry input in response to a second carry input and a user configurable input, (iii) propagate said first carry input to a second macrocell and (iv) propagate said first intermediate signal to a third macrocell; and a product term array configured to generate said first and said second carry input product terms for each of said one or more macrocells.

2. The programmable logic device according to claim 1, wherein said logic comprises:

a first logic circuit configured to logically combine said first and said second carry input product terms to generate said first intermediate signal.

3. The programmable logic device according to claim 2, wherein said logic further comprises:

an input selector having a first input connected to a logic input to said macrocell and a second input connected to a second input to said macrocell.

4. The programmable logic device according to claim 3, wherein said logic further comprises:

a carry generator configured to select said first carry input product term or said second carry input product term for presentation at an output as said first carry input in response to a second intermediate signal, wherein said carry generator has an inverting input and a non-inverting input;

a carry decoupler configured to generate said second intermediate signal in response to said second carry input and said user configurable input; and a second logic circuit configured to logically combine said first carry input and an output of said input selector to generate a sum bit.

5. The programmable logic device according to claim 4, wherein the carry generator comprises a first multiplexer of size x:1, wherein x is at least equal to 2 and wherein a select line of said first multiplexer is coupled to said output of the carry decoupler.

6. The programmable logic device according to claim 4, wherein the carry decoupler is configured to logically combine said second carry input and said user configurable input.

7. The programmable logic device according to claim 4, wherein the carry decoupler includes one of an AND gate and a multiplexer having a user configurable select line.

8. The programmable logic device according to claim 4, further comprising a multiplexer controllable by a pair of user configurable inputs, the multiplexer having a first input coupled to a first voltage supply source, a second input coupled to an output of a register, a third input coupled to the output of the carry generator and a fourth input coupled to a second voltage supply source.

9. The programmable logic device according to claim 1, wherein said logic comprises one or more of the group consisting of a NOR gate, an OR gate, an XNOR gate, and an XOR gate.

10. The programmable logic device according to claim 3, wherein said input selector comprises a multiplexer controlled by a user configurable select line.

11. The programmable logic device according to claim 2, wherein said first intermediate signal comprises an XOR or an XNOR of input terms to said product term array.

12. A method for implementing a carry chain and adder, comprising the steps of:

(A) logically ANDing a first carry input with a user-configurable input to produce a first intermediate result;

(B) selecting one of two carry input product terms from a product term array based upon the first intermediate result to provide a second carry input to a first macrocell;

(C) propagating said second carry input to a second macrocell;

(D) logically combining said carry input product terms to produce a second intermediate result; and (E) propagating said second intermediate result to a third macrocell.

13. The method according to claim 12, further comprising the step of:

(F) repeating the ANDing, selecting, combining and propagating steps until a last macrocell of the chain is reached.

14. The method according to claim 12, wherein the selecting step includes the step of converting one of the two carry product terms to a complement form.

15. The method according to claim 12, further including the step of decoupling a macrocell from the chain by setting the user configurable input of the macrocell to be decoupled to a predetermined state.

16. The method according to claim 12, wherein the selecting step generates a carry input term for an ith sum term of a ripple carry full adder, and further comprises the step of providing logically ANDed (i–1)th sum operands as each of the two carry input product terms.

17. The method according to claim 16, wherein the combining step generates a logical XOR or XNOR of said (i–1)th sum operands.

18. An N-bit ripple carry adder comprising:

N+1 macrocells each configured to (i) generate a first intermediate signal in response to a first carry input product term and a second carry input product term, (ii) select one of said first and said second carry input product terms as a first carry input in response to a second carry input and a user configurable input, (iii) propagate said first carry input signal to a second macrocell of said N+1 macrocells and (iv) propagate said first intermediate signal to a third macrocell of said N+1 macrocells; and a product term array configured to generate said first and said second carry input product terms for each of said N+1 macrocells.

19. The N-bit ripple carry adder according to claim 1, wherein each of said N+1 macrocells comprises:

a carry generator configured (i) to generate said first carry input in response to said first and said second carry input product terms and a second intermediate signal and (ii) to propagate said first carry input to said second macrocell;

a carry decoupler configured to selectively couple or decouple said macrocell from said third macrocell by generating said second intermediate signal in response to said second carry input and said user configurable input;

a first logic circuit configured to logically combine said first and said second carry input product terms to generate said first intermediate signal and to propagate said first intermediate signal to said third macrocell;

an input selector having a first input connected to a logic input to said macrocell and a second input configured to receive a signal from said second macrocell; and a second logic circuit configured to logically combine said first carry input and an output of said input selector to generate a sum bit.

20. The N-bit ripple carry adder according to claim 18, wherein said (N+1)th macrocell generates a final carry output.

* * * * *